United States Patent
Lu et al.

(10) Patent No.: US 6,693,047 B1
(45) Date of Patent: Feb. 17, 2004

(54) METHOD FOR RECYCLING SEMICONDUCTOR WAFERS HAVING CARBON DOPED LOW-K DIELECTRIC LAYERS

(75) Inventors: Chih-Cheng Lu, Taipei (TW); Wen Chang, Taipei (TW); Syun-Ming Jeng, Hsin-Chu (TW)

(73) Assignee: Taiwan Semiconductor Manufacturing Co. Ltd., Hsin-Chu (TW)

(*) Notice: Subject to any disclaimer, the term of this patent is extended or adjusted under 35 U.S.C. 154(b) by 0 days.

(21) Appl. No.: 10/324,532

(22) Filed: Dec. 19, 2002

(51) Int. Cl.$^7$ .................. H01L 21/31; H01L 21/469
(52) U.S. Cl. ............... 438/770; 438/756; 438/771; 438/787
(58) Field of Search ................ 438/745, 756, 438/770, 771, 787, 788

(56) References Cited

U.S. PATENT DOCUMENTS

| | | | |
|---|---|---|---|
| 6,168,726 B1 * | 1/2001 | Li et al. | 216/79 |
| 6,346,490 B1 * | 2/2002 | Catabay et al. | 438/795 |
| 6,407,013 B1 * | 6/2002 | Li et al. | 438/788 |
| 6,486,061 B1 * | 11/2002 | Xia et al. | 438/680 |
| 6,562,700 B1 * | 5/2003 | Gu et al. | 438/477 |
| 2003/0032305 A1 * | 2/2003 | Yau et al. | 438/778 |

* cited by examiner

Primary Examiner—Alexander Ghyka

(57) ABSTRACT

A method for removing at least one carbon doped oxide layer over a surface to recycle the semiconductor process wafer including providing a semiconductor wafer including a process surface including at least one carbon doped silicon oxide layer; oxidizing the carbon doped oxide layer according to an oxidizing treatment to convert at oxidize at least a portion of the carbon doped oxide layer to produce silicon oxide; and, wet etching the silicon oxide to substantially remove the silicon oxide.

20 Claims, 2 Drawing Sheets

METHOD FOR RECYCLING SEMICONDUCTOR WAFERS HAVING CARBON DOPED LOW-K DIELECTRIC LAYERS

FIELD OF THE INVENTION

This invention generally relates to semiconductor wafer manufacturing of multi-layered semiconductor structures and more particularly to a method for recycling the semiconductor process wafer including carbon-doped low-k dielectric layers.

BACKGROUND OF THE INVENTION

The escalating requirements for high density and performance associated with ultra large scale integration semiconductor wiring have increasingly required the use of low-k (low dielectric constant) dielectric insulating layers to increase signal transport speeds as device sizes have decreased.

Typical low-k materials in use have included carbon doped oxides (e.g., silicon dioxide) using commercially available precursors and processes such as SiLK™ and BLACK DIAMOND™ processes. Such carbon doped oxides are also known as organo-silicate glasses (OSG) formed by chemical vapor deposition (CVD) processes from organo-silane and organo-siloxane precursors. CVD carbon doped oxide low-k dielectrics typically consist of a porous and low density material to thereby reduce the overall dielectric constant, for example, less than about 3.2. Carbon doped oxides are used in a variety of semiconductor structures, typically by forming multiple layers of the carbon doped oxides within which other semiconductor structures such as metal interconnect lines are formed. For example, carbon doped oxides may be used as dielectric insulting layers also known as inter-metal dielectric (IMD) layers, thin films of capping layers or as a filling material for certain structures.

Frequently, for various reasons, a semiconductor wafer, for example a silicon semiconductor wafer forming the process wafer base for forming devices, is recycled following the unacceptable processing of overlying layers in a multi-layer semiconductor device manufacturing process. Any number of processing problems may occur, for example, with deposition of the carbon doped oxide or other problems with other processes used to create device features. A number of quality control testing methods are preformed following selected processing steps generally referred to as wafer acceptance testing (WAT) where the acceptability of the semiconductor process wafer may be rejected and 'scrapped' for various reasons resulting in a significant non-productive cost.

The prior art practice has been to send the rejected or scrapped process wafers to wafer suppliers for processing where the dielectric layers including carbon doped oxide layers are removed to allow the semiconductor wafer base to be reused. The prior art practice to remove carbon doped oxide layers has been to use a wafer polishing process including chemical and mechanical methods to remove the various dielectric layers overlying the base semiconductor wafer. Following removal of dielectric layers and other features overlying the semiconductor wafer, the semiconductor wafer is recycled or reused for a new multi-layer semiconductor device manufacturing process. The prior art practice has been to provide the scrapped process wafers to an outside party for recycling as the batch wafer polishing processes are not compatible with device manufacturing tools or processes. As semiconductor wafer manufacturing move to larger diameter wafers, for example 12 inch wafers, the cost of scrapping or recycling a process wafer will increase.

There is therefore a need in the semiconductor manufacturing to art to develop a process whereby dielectric layers including carbon doped oxide layers may be removed from rejected semiconductor wafers for recycling that can be performed in-house and is compatible with existing manufacturing processes.

It is therefore an object of the invention to a process whereby dielectric layers including carbon doped oxide layers may be removed from rejected semiconductor wafers for recycling that can be performed in-house and is compatible with existing manufacturing processes while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for removing at least one carbon doped oxide layer over a surface to recycle the semiconductor process wafer.

In a first embodiment the method includes providing a semiconductor wafer including a process surface including at least one carbon doped silicon oxide layer; oxidizing the carbon doped oxide layer according to an oxidizing treatment to convert at oxidize at least a portion of the carbon doped oxide layer to produce silicon oxide; and, wet etching the silicon oxide to substantially remove the silicon oxide.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

Figure 1A:
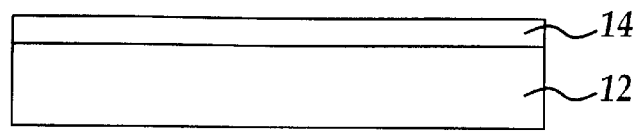
FIGS. 1A–1C are cross sectional diagrams of a portion of a semiconductor wafer including a carbon doped oxide layer showing steps in an oxidizing treatment process according to an embodiment of the present invention.

Referring to FIG. 1A is shown an exemplary cross sectional portion of a multilayer semiconductor device including a semiconductor substrate 12, for example silicon, including at least one overlying dielectric insulating layer e.g., 14 formed of a carbon doped oxide, for example a carbon doped silicon oxide also known as organo-silicate glass (OSG) forming a low dielectric constant (low-k) layer, for example having a dielectric constant of less than about 3.2. The dielectric insulating layer 14 may be formed by conventional CVD processes, for example PECVD or by spin on processes. For example, the dielectric insulating layer may include commercially available proprietary processes to produce, for example, BLACK DIAMOND™, and SiLK™ dielectric insulating layers. For example, the dielectric insulating layer 14 is typically formed having a thickness of about 3000 to about 10,000 Angstroms. It will be appreciated that the dielectric insulating layer 14 may include or cover various semiconductor devices, for example include metal interconnect structures such as vias or trench lines (not shown) formed in the dielectric insulating layer or be formed overlying transistors or logic devices formed in contact with the underlying silicon substrate 12 (not shown). In addition, it will be appreciated that multiple dielectric insulating layers including other dielectric materials forming portions of a multi-layer semiconductor device, such as etching stop layers may be present as are known in the art.

Figure 1B:
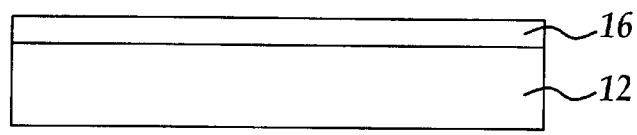
Figure 1C:

Referring to FIG. 1B, according to an embodiment of the method of the present invention the low-k dielectric layer is subjected to an oxidizing treatment to transform a portion of the carbon doped oxide layer into an oxide layer 16 substantially free of carbon, for example silicon oxide, oxidizing the carbon present such that the resulting oxide layer substantially free of carbon may be removed by a wet etching process. Preferably, the wet etching process includes a hydrofluoric acid (HF) containing wet oxide etchant, for example diluted HF or diluted HF buffered with ammonium fluoride ($NH_4F$) also referred to as buffered oxide etch (BOE). Preferably, a substantial portion of the carbon present in the carbon doped oxide layer is removed, typically present in the form of hydrogenated carbon (e.g., $CH_x$) where x is typically 3 as in methyl groups. Referring to FIG. 1C, the oxide layer 16 is then removed according to a wet etching process using a hydrofluoric acid (HF) containing wet oxide etchant.

In one embodiment, the carbon doped dielectric layer is subjected to an oxidizing treatment to form an oxide layer 16 in a batch wafer process where a plurality of process wafers, for example about 100 to about 150 wafers, each including one or more carbon doped dielectric layers, are heated in a furnace in the presence of an oxygen containing ambient. The furnace may be a horizontal or vertically oriented furnace operating at reduced pressure or atmospheric pressure.

In one embodiment, the oxidizing treatment (oxidation process) is a controlled ambient process where the partial pressure of oxygen is varied from about $10^{-2}$ atmosphere to 1 atmosphere, for example by providing a mixture of oxygen and a diluent gas, including for example hydrogen, nitrogen, and argon, to control the partial pressure of oxygen. Within safety constraints, it is preferably to operate at a higher partial pressure of oxygen since the oxidation rate is about proportional to $p^{0.8}$ where P is the partial pressure of oxygen. For example extended ramp (ER) furnaces or small batch fast ramp furnaces (SBFR) may be used to reduce an oxidation cycle time. In an exemplary embodiment, the oxidizing treatment is carried out over a temperature range of about 800° C. to about 1150° C., a higher temperature preferred to increase an oxidation rate. For example a flow rate of gas having a volumetric ratio of oxygen to hydrogen of about 2 to 1 is provided at a flow rate of about 5 to about 10 SLM (standard liters/min). It will be appreciated that separate flow rates of oxygen and hydrogen may be provided to make up a furnace volumetric ratio of oxygen to hydrogen of about 2 to 1. Preferably the oxidizing treatment is carried for a time period sufficient to oxidize a substantial amount of the carbon in the carbon doped oxide layer, for example oxidizing greater than about 98 percent.

In another embodiment, the oxidizing treatment is carried out in a furnace open to atmosphere where a flow of oxygen gas is passed over the wafer process surfaces, for example providing oxygen gas at a flow rate of about 10 to about 20 SLM at a temperature of about 500° C. to about 800° C. It will be appreciated that the appropriate oxidation time is determined by the oxidation kinetics and the thickness of the carbon doped dielectric layer, for example a carbon doped dielectric layer having a thickness of about 6000 Angstroms requires annealing in an oxygen ambient at about 500° C. to about 1100° C. for about 1.5 to about 3.5 hours to substantially oxidize the carbon in the carbon doped dielectric layer.

In another embodiment, the oxidizing treatment is carried out with a high pressure oxidation (HIPOX) system operating from about 1 atm to about 25 atmospheres at a temperature of about 600° C. to about 1000° C. where a wet or dry oxygen containing ambient, for example oxygen diluted with an inert gas at a volumetric concentration of about 20 percent to about 80 percent is provided. The high pressure of the reactor increases the oxidation rate of the carbon doped layer reducing the required oxidation time to about 1 to about 2 hours.

In another embodiment, the oxidizing treatment is carried out according to a plasma enhanced oxidation treatment. In this embodiment, the plasma enhanced oxidation treatment may be carried out on a single wafer disposed in a conventional plasma reactor, for example a plasma reactor used in a plasma etching process. The plasma enhanced oxidation treatment may additionally include other conventional plasma reactor configuration and plasma sources including high density, medium density and low density plasmas. For example, the plasma source may include an electron-cyclotron-resonance (ECR) source, a helicon plasma source, an inductively coupled plasma (ICP) source, a decoupled plasma source (DPS), or a magnetically enhanced RIE (MERIE), or a barrel etcher for batch operations.

In one embodiment, the oxidizing treatment is carried out in a plasma etcher, for example an ICP or TCP configuration, including a conventional etching chemistry in addition to oxygen. Preferably, the plasma enhanced oxidation treatment operating conditions include operating at a higher RF power compared to conventional etching processes, for example about 1000 Watts to about 3000 Watts and operating at a higher bias power, for example from about 500 Watts to about 1000 Watts. Operating a higher RF power and bias power has been found to increase the oxidation rate and oxidation penetration into the carbon doped layer while simultaneously etching away a portion of the dielectric layer. Preferably, plasma source gases include one or more fluorocarbons, such as $C_5F_8$ or similar carbon to fluorine ratio (e.g., greater than about 1:2), an inert gas such as argon and nitrogen, and oxygen.

In an exemplary implementation, the plasma oxidizing treatment is carried out in a single wafer plasma etcher where source gas flow conditions include a flow rate of at least one fluorocarbon, for example $C_4F_5$, at a flow rate of about 500 to about 600 sccm, and an oxygen flow rate of about 300 to about 400 sccm. The RF power electrode (e.g., top electrode is operated at about 1000 to about 3000 Watts and the bias electrode (e.g., bottom electrode) is operated at about 500 to about 1000 Watts. The substrate temperature is maintained at about 30° C. to about 60° C. The plasma oxidizing treatment process is carried out, for example at about 5 to about 10 milliTorr for about 2 to about 3 minutes. It will be appreciated that the plasma oxidizing treatment time will vary depending on the thickness of the carbon doped dielectric layer.

In another embodiment, the plasma enhanced oxidizing treatment includes an oxygen ambient optionally diluted with a diluent gas. For example in an exemplary implementation, the plasma enhanced oxidizing treatment is carried out in a single wafer plasma PECVD reactor including an oxygen containing ambient in the absence of fluorocarbons. For example, the oxygen flow rate provided to the reactor is about 1500 to about 2000 sccm where, for example the total oxygen concentration is about 50 percent to about 100 volume percent with respect to the total volume of plasma source gases provided to the plasma reactor, with the oxygen optionally being diluted with a diluent gas such as an inert gas or nitrogen. The RF power electrode, for example is operated at about 500 to about 2000 Watts. Preferably, the temperature of the wafer is maintained at about 300° C. to about 400° C. The plasma oxidizing treatment process is carried out, for example at about 4 to about 5 Torr for about 2 to about 3 minutes. It will be appreciated that the plasma oxidizing treatment time will vary depending on the thickness of the carbon doped dielectric layer.

In another embodiment, the plasma enhanced oxidation treatment is carried out over the range of about 0.5 Torr to about 2 Torr in a batch wafer plasma oxidizing treatment carried out in a barrel etcher, for example with oxygen provided at a concentration of about 50 volume percent to about 80 volume percent with respect to the total volume of plasma source gases provided to the plasma reactor.

Following the oxidizing treatment, the oxidized carbon doped oxide layer being preferably substantially transformed into an oxide layer, for example silicon oxide, is subjected to a wet oxide etching treatment to remove the oxide layer. Preferably, the wet etching process is a hydrofluoric acid (HF) containing wet oxide etchant, for example diluted HF or HF buffered with a buffering agent, for example ammonium fluoride ($NH_4F$) also referred to as buffered oxide etch (BOE). For example, the concentration of diluted HF is one part electronic grade HF (49% HF by weight) to about 40 to about 60 parts deionized water. For example, the BOE includes about 1 part buffered HF etching solution to about 6 parts water, the buffered HF solution formed by, for example, about 1 part electronic grade HF and about 10 parts ammonia buffer, for example about 454 g $NH_4F$ is 680 ml $H_2O$.

Preferably the wet etching process includes immersion (dipping) of the wafer or batch of wafers in the wet oxide etching solution including an optional source of agitation, such as stirring or ultrasonic agitation. Other processes such as spraying and brushing may optionally be used. For example in a dipping process using a dilute HF oxide etching solution with an oxide layer having a thickness of about 5600 Angstroms, the oxide layer is substantially removed in a period of about 1500 to about 2000 seconds.

Figure 2:
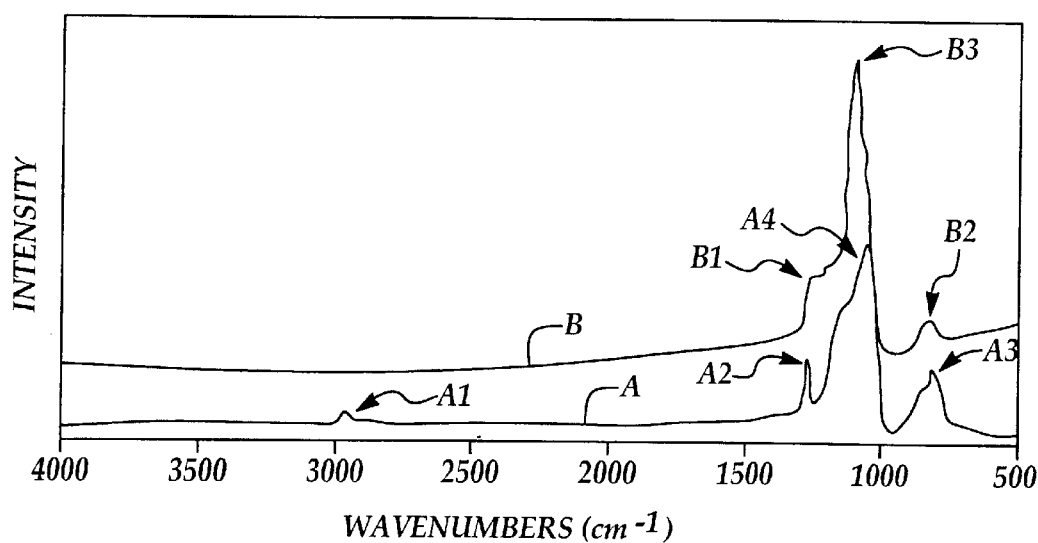
FIG. 2 is FTIR data of a carbon doped oxide layer shown before and following an oxidizing treatment process according to an embodiment of the present invention.

For example, referring to FIG. 2 is FTIR data obtained on a process wafer including a carbon doped low-k oxide layer before carrying out an exemplary oxidizing treatment process, and following a batch oxidation furnace oxidation process according to preferred embodiments. On the horizontal axis are wave numbers corresponding to vibrational mode frequencies of atomic groups. On the vertical axis are arbitrary intensity units proportional to a relative concentration of the various atomic groups. Line A represents the wafer process surface including the carbon doped oxide layer, for example having a thickness Angstroms in thickness, before carrying out the oxidizing treatment process. Line B shows the resulting spectra following the oxidizing treatment process according to a preferred embodiment. For example, peak A-1 represent a vibration mode of CH groups while lines A-2 and A-3 represent vibrational modes of Si—$CH_3$ groups. The largest peak A-4 represents the Si—O vibrational mode. Following an exemplary batch wafer oxidation treatment, for example treatment in flowing oxygen at atmospheric pressure for about 2 hours at about 550° C., an FTIR measurement spectra as indicated by line B is obtained, where the Si—O vibrational mode shown at peak B-3 has increased and additional Si—O vibrational modes B-1 and B-2 have appeared. The vibrational modes Si—$CH_3$ and CH are absent from the FTIR spectra following the oxidizing treatment indicating the carbon doped oxide has been substantially oxidized and transformed into silicon oxide. Following an exemplary wet oxide etching treatment to remove the silicon oxide layer, for example immersing in a dilute HF solution for a period of about 1800 seconds, substantially all of the silicon oxide layer is removed leaving a within-wafer uniformity of less than about 1 percent.

Figure 3:
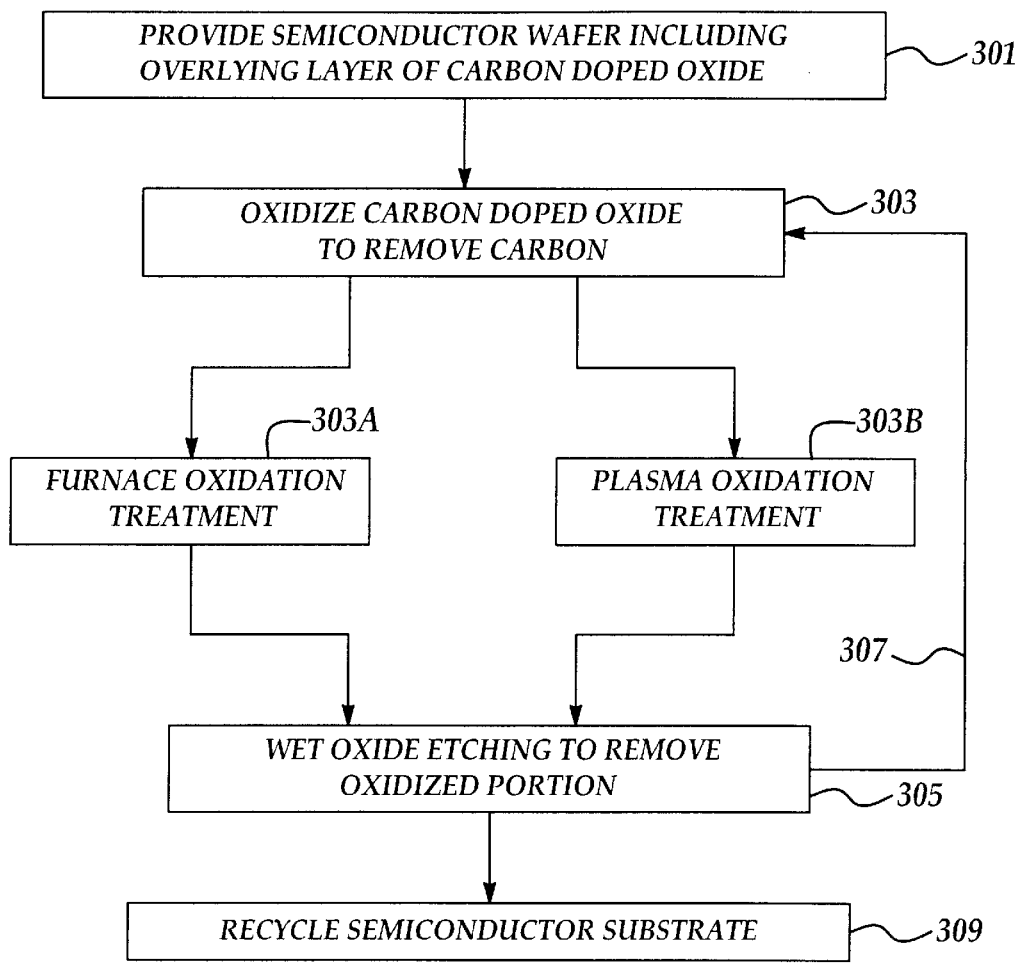
FIG. 3 is a process flow diagram including several embodiments of the present invention.

Referring to FIG. 3 is shown a process flow diagram including several embodiments of the present invention. In process 301 one or more semiconductor wafers including at least one carbon doped oxide layer are provided. In process 303 an oxidizing treatment process is carried out to oxidize a portion, preferably a substantial portion of the carbon doped oxide layer to form a substantially carbon free oxide layer. In process embodiment 303A, the oxidizing treatment process is carried out in a furnace, preferably in a batch process, including an oxygen containing ambient. In process embodiment 303B, the oxidizing treatment includes a plasma enhanced oxidizing treatment. In process 305, a wet oxide etching process is carried out to remove the oxidized portion of the oxide layer. As indicated by process directional arrow 307, the process of the oxidizing treatment and wet etching process may optionally be repeated to remove additional carbon doped oxide layers. In process 309, the semiconductor substrate, for example a silicon wafer is recycled for reuse as a base substrate in a multi-layer semiconductor device manufacturing process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for removing at least one carbon doped oxide layer over a surface to recycle the semiconductor process wafer comprising the steps of:
   providing a semiconductor wafer including a process surface comprising at least one carbon doped silicon oxide layer;
   oxidizing the carbon doped oxide layer according to an oxidizing treatment to convert and oxidize at least a portion of the carbon doped oxide layer to produce silicon oxide; and,
   wet etching the silicon oxide to substantially remove the silicon oxide.

2. The method of claim 1, further comprising repeating the steps of oxidizing and wet etching to remove the at least one carbon doped oxide layer.

3. The method of claim 1, wherein the at least one carbon doped oxide layer is substantially oxidized to produce a silicon oxide layer.

4. The method of claim 1, wherein the carbon doped oxide layer comprises carbon methyl groups.

5. The method of claim 1, wherein the oxidizing treatment process comprises an oxidizing process selected from the group of furnace oxidation processes and plasma enhanced oxidation processes.

6. The method of claim 5, wherein the oxidizing treatment process comprises a batch furnace oxidation process including flowing oxygen and hydrogen carried out at a temperature of from about 500° C. to about 1500° C.

7. The method of claim 5, wherein the oxidizing treatment process comprises a batch furnace oxidation process open to atmosphere including flowing oxygen carried out at a temperature of from about 500° C. to about 1000° C.

8. The method of claim 5, wherein the oxidizing treatment process comprises a plasma enhanced oxidation process carried out in a plasma etcher the plasma source gas comprising at least one fluorocarbon and oxygen at an RF power of about 1000 Watts to about 3000 Watts and a pressure of about 5 to about 100 milliTorr.

9. The method of claim 5, wherein the oxidizing treatment process comprises a plasma enhanced oxidation process carried out in a PECVD plasma reactor the plasma source gas comprising mostly oxygen at an RF power of about 500 Watts to about 1000 Watts and a pressure of about 1 to about 10 Torr.

10. The method of claim 1, wherein the step of wet etching comprises immersion in an oxide etching solution.

11. The method of claim 10, wherein the oxide etching solution is selected from the group consisting of a diluted hydrofluoric (HF) acid solution and a buffered HF solution.

12. A method for removing a carbon doped oxide layer according to an oxide wet etching process comprising the steps of:
providing a semiconductor wafer including a process surface comprising at least one carbon doped oxide layer;
oxidizing the carbon doped oxide layer according to an oxidizing treatment to remove a substantial portion of carbon included in the carbon doped oxide layer to produce an oxide layer; and,
wet etching the oxide layer to substantially remove the oxide layer.

13. The method of claim 12, further comprising repeating the steps of oxidizing and wet etching to reveal a semiconductor substrate.

14. The method of claim 13, wherein the semiconductor substrate comprises silicon.

15. The method of claim 1, wherein the oxidizing treatment process comprises an oxidizing process selected from the group of furnace oxidation processes and plasma enhanced oxidation processes.

16. The method of claim 5, wherein the oxidizing treatment process comprises a batch furnace oxidation process including flowing oxygen and hydrogen at an oxygen to hydrogen ratio of about 2:1 carried out at a temperature of from about 500° C. to about 1500° C.

17. The method of claim 5, wherein the oxidizing treatment process comprises a batch furnace oxidation process open to atmosphere including flowing oxygen over a plurality of wafer surfaces at a flow rate of about 10 to about 20 SLM carried out at a temperature of from about 500° C. to about 1000° C.

18. The method of claim 5, wherein the oxidizing treatment process comprises a plasma enhanced oxidation process carried out in a plasma etcher the plasma source gas comprising at least one fluorocarbon and oxygen at an RF power of about 1000 Watts to about 3000 Watts including a bias power of about 500 Watts to about 1000 Watts and a pressure of about 5 to about 100 milliTorr.

19. The method of claim 5, wherein the oxidizing treatment process comprises a plasma enhanced oxidation process carried out a PECVD plasma reactor the plasma source gas comprising about 50 to about 100 percent oxygen at an RF power of about 500 Watts to about 1000 Watts and a pressure of about 1 to about 10 Torr.

20. The method of claim 10, wherein the oxide etching solution selected from the group consisting of a diluted hydrofluoric (HF) acid solution and a buffered HF solution.

* * * * *